United States Patent
Anderson

(10) Patent No.: US 7,506,527 B2
(45) Date of Patent: Mar. 24, 2009

(54) MAKING INTEGRAL HEAT SPREADER BY COINING

(75) Inventor: Russell J. Anderson, Santa Barbara, CA (US)

(73) Assignee: Honeywell International, Inc., Morriwtown, NJ (US)

( * ) Notice: Subject to any disclaimer, the term of this patent is extended or adjusted under 35 U.S.C. 154(b) by 0 days.

(21) Appl. No.: 10/257,594

(22) PCT Filed: Apr. 10, 2001

(86) PCT No.: PCT/US01/11782

§ 371 (c)(1),
(2), (4) Date: Apr. 4, 2003

(87) PCT Pub. No.: WO01/76789

PCT Pub. Date: Oct. 18, 2001

(65) Prior Publication Data

US 2004/0123639 A1    Jul. 1, 2004

(51) Int. Cl.
*B21D 22/00* (2006.01)
*B21D 13/00* (2006.01)
*B21D 45/00* (2006.01)

(52) U.S. Cl. ............... 72/361; 72/346; 72/355.6

(58) Field of Classification Search ............ 72/344, 72/346, 355.6, 359, 361, 424, 330, 335, 336, 72/404, 405.01, 405.03
See application file for complete search history.

(56) References Cited

U.S. PATENT DOCUMENTS

| | | | | |
|---|---|---|---|---|
| 2,839,955 A | | 6/1958 | Lovendahl | 78/17 |
| 3,624,708 A | | 11/1971 | Richardson | 72/424 |
| 3,893,325 A | * | 7/1975 | Sato | 72/344 |
| 3,910,096 A | | 10/1975 | Debus | 72/344 |
| 4,284,670 A | | 8/1981 | Kole | 427/422 |
| 4,932,822 A | * | 6/1990 | De Silva et al. | 413/66 |
| 5,289,039 A | * | 2/1994 | Ishida et al. | 257/796 |
| 5,789,810 A | | 8/1998 | Gross et al. | 257/704 |

* cited by examiner

*Primary Examiner*—Dana Ross
*Assistant Examiner*—Teresa Bonk
(74) *Attorney, Agent, or Firm*—Sandra P. Thompson; Buchalter Nemer

(57) ABSTRACT

A method and apparatus for automatically separating blanks from a copper strip (200) and coining heat spreader lids (400) from the blanks. A high speed blanking structure (208) severs single rectangular or square blanks (212) from the copper strip. The blanks are loaded into a cartridge (214), and placed in a blanks hopper (213). The blanks are transferred from the hopper to a rotatable turret (217). The turret rotates to move a blank to a coining die cavity of a coining press (305). The blank is coined to form a lid and returned to the turret to be delivered to an unload station where the lid is dropped onto a conveyor (310). The conveyor transports the lid to a deburr and clean station (610).

10 Claims, 17 Drawing Sheets

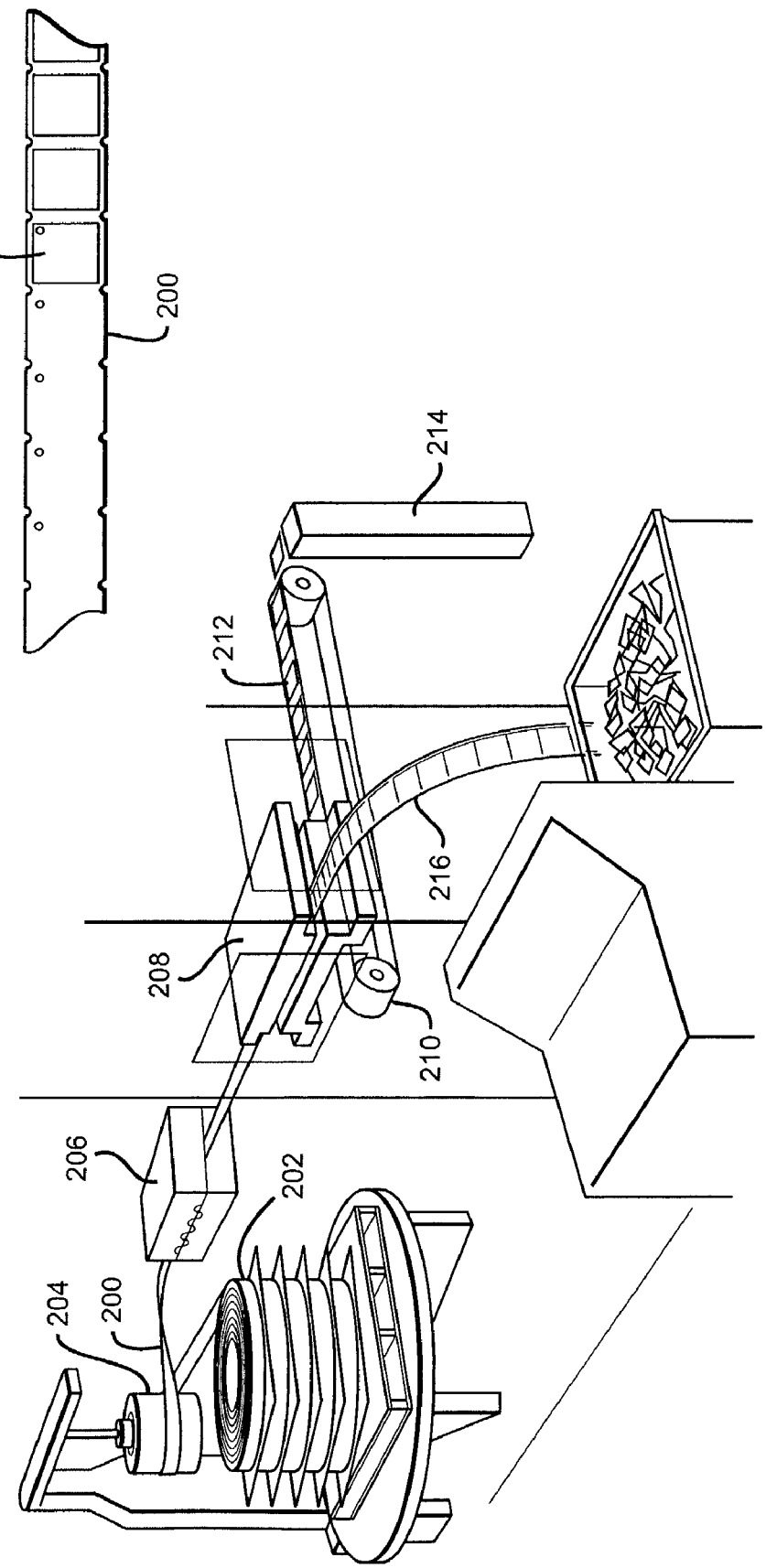

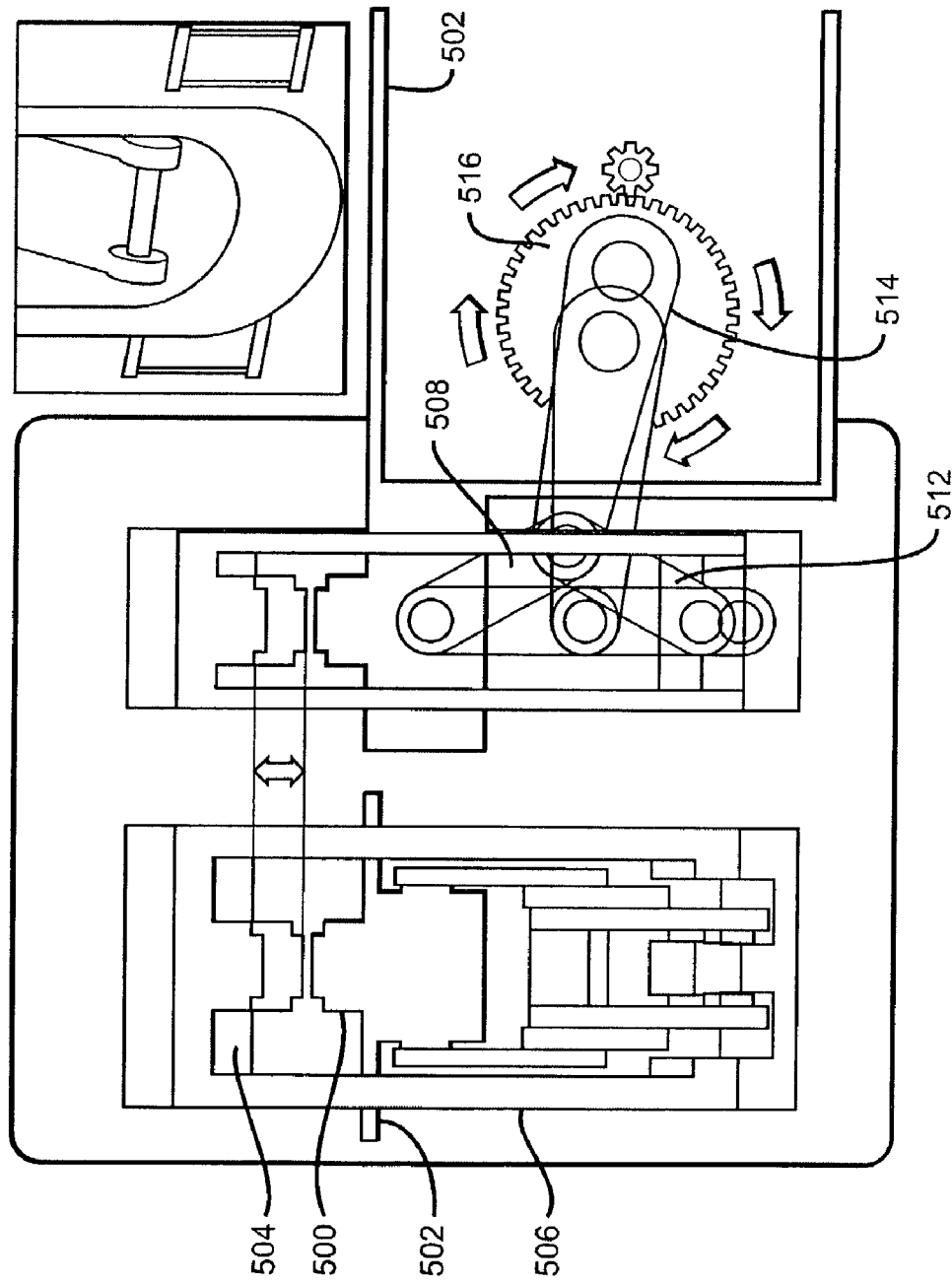

MAKING INTEGRAL HEAT SPREADER BY COINING

BACKGROUND

1. Field

This invention relates generally to semiconductor chip devices, and in particular to the manufacture of a heat spreader lid that is part of a multi-piece integrated heat spreader/heat sink/stiffener assembly in a semiconductor package which reduces stress and warping of a semiconductor die during attachment of the die to a substrate.

2. Description of the Prior Art

In semiconductor device assembly, a semiconductor chip (also referred to as an integrated circuit chip or "die") is bonded directly to a packaging substrate. Semiconductor packages that have been soldered to a motherboard and placed in a computer are typically subjected to temperature cycling during computer operation. Therefore, the semiconductor packages require a way to permit excess heat to be radiated into the surrounding air so that the heated air can be removed by cooling fans. A heat spreader lid, composed of a high thermal conductivity material, and having substantially the same dimensions as the package substrate, is attached over the die and bonded by a thermally conductive adhesive which is heat cured. A conventional heat spreader is typically a flat piece of nickel-plated copper about 20 to 40 mils thick. A metal plate called a heat sink, which includes metal fins to promote rapid radiation of excessive heat, is bonded by a thermally conductive adhesive to the flat surface of the heat spreader lid. The purpose of the heat spreader and heat sink is to disperse the heat generated during thermal cycling in order to reduce stress in the package due to different coefficients of thermal expansion of the various elements of the package, including the die, substrate and underfill. Such stress in the semiconductor package may ultimately result in electronic and/or mechanical failure, including cracking of the die. It is desirable that the lid be in the form of a cap with side that will fit over the semiconductor package to further constrain the substrate in order to prevent warping or other movement relative to the die which may be caused by thermal cycling.

Conventional processes for manufacturing a heat spreader use a progressive die wherein raw material is taken from a copper coil and run through a progressive die (blanking, coining and piercing) so that the result at the end of the progression is supposed to be a finished part. The problem with this process is that it does not result in a part off of the coining press that meets minimum specifications for flatness. There must be subsequent grinding and finishing to bring the part into compliance with minimum specifications for flatness, which is critical for the heat spreader to make uniform contact with the semiconductor die.

SUMMARY

Briefly the invention is concerned with a method and apparatus for automatically separating blanks from a copper strip and coining heat spreader lids from the blanks. A high speed blanking structure severs single rectangular or square blanks from the copper strip. The blanks are loaded into a cartridge, After an inspection, the cartridge is placed in a blanks hopper. The blanks are transferred from the hopper to a rotatable turret. The turret rotates to move a blank to a coining die cavity of a coining press. The blank is coined to form a lid and returned to the turret. The lid is delivered by the turret to an unload station where the lid is dropped onto a conveyor. The conveyor transports the lid to a deburr and clean station.

The invention has the advantage that the teachings of the invention are easily adapted to manual systems, semi-automatic systems and fully automatic systems.

The invention has the advantage that the teachings of the invention are easily adapted to blanks that are on a continuous reel or single blanks.

The invention has the advantage that it can handle coining blanks that are square or rectangular in shape.

BRIEF DESCRIPTION OF THE DRAWINGS

The invention will be described in greater detail with reference to the drawings in which:

FIG. 2a is a perspective view of a high speed blanking station;

FIG. 2b is a top view of the copper strip shown in FIG. 2a;

FIG. 2c is a perspective view of the loading mechanism of the high speed blanking press shown in FIG. 2a;

FIG. 2d is a front elevation view of the loading mechanism of the high speed blanking press shown in FIG. 2a;

FIG. 2e is a top view of the loading mechanism of the high speed blanking press shown in FIG. 2a;

FIG. 2f is a cross-sectional view of the loading mechanism of the high speed blanking press shown in FIG. 2a;

FIG. 3b is a top view of the coining process mechanism shown in FIG. 2a;

FIG. 3c is a cross-sectional view of the coining process mechanism shown in FIG. 2a;

FIG. 3d is a top view of the coining turret shown in FIG. 3a;

FIGS. 5a-5e are side sectional views of a coining die within the coining press shown in FIGS. 3a-3b during successive stages of operation; and, FIGS. 6-9 are flow diagrams of software for controlling the operation of the apparatus shown in FIGS. 1-5.

In these figures, similar numerals refer to similar elements in the drawing. It should be understood that the sizes of the different components in the figures may not be to scale, or in exact proportion, and are shown for visual clarity and for the purpose of explanation.

DETAILED DESCRIPTION

Figure 1:
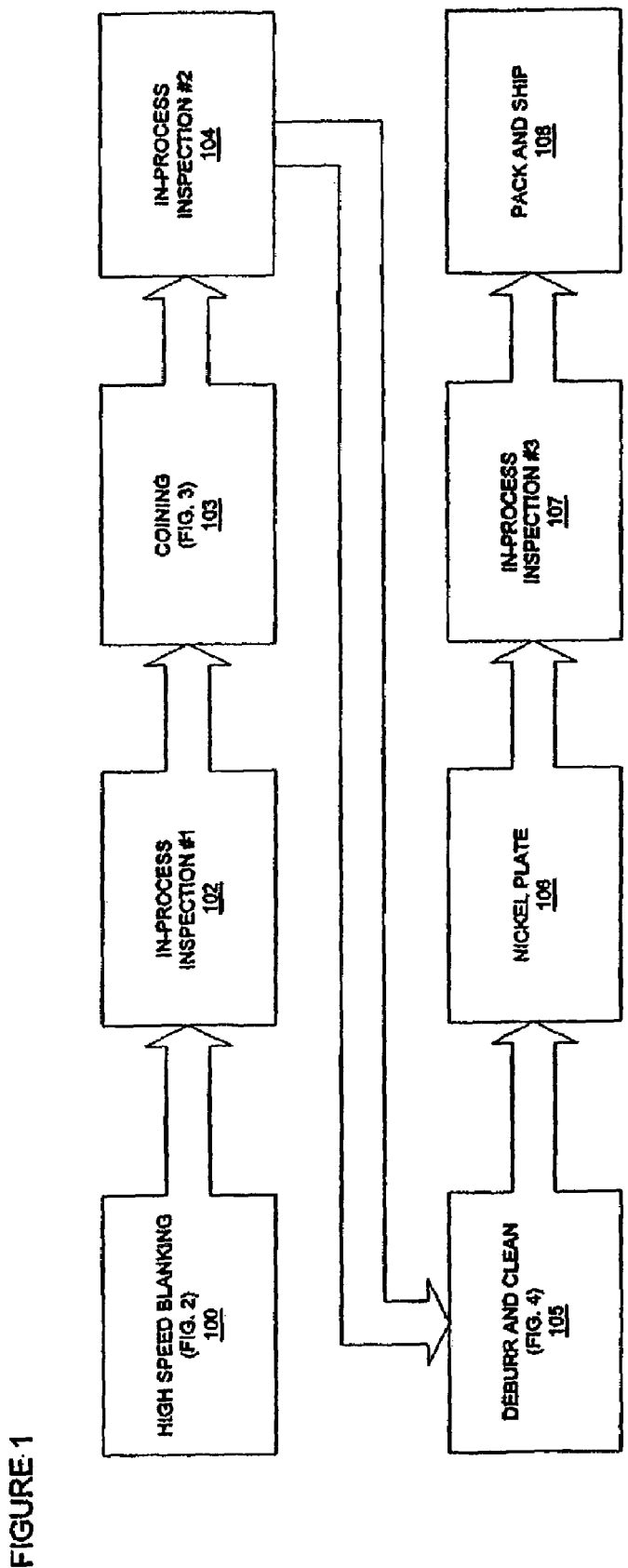
FIG. 1 is a flow diagram of the method of the present invention.

Refer to FIG. 1, which is a flow diagram of the method of the present invention. A high speed blanking structure severs single rectangular or square blanks from a copper strip (100). The blanks are loaded into a cartridge and moved to an inspection station (102). After an inspection, the blank is coined to form a lid (103). The lid is inspected (104). After an inspection, the lid is delivered to a deburr and clean station (105) and is nickel-plated (106). The plated lid is moved to an inspection station (107). After an inspection, the finished product is packed and shipped (108).

Figure 2C:
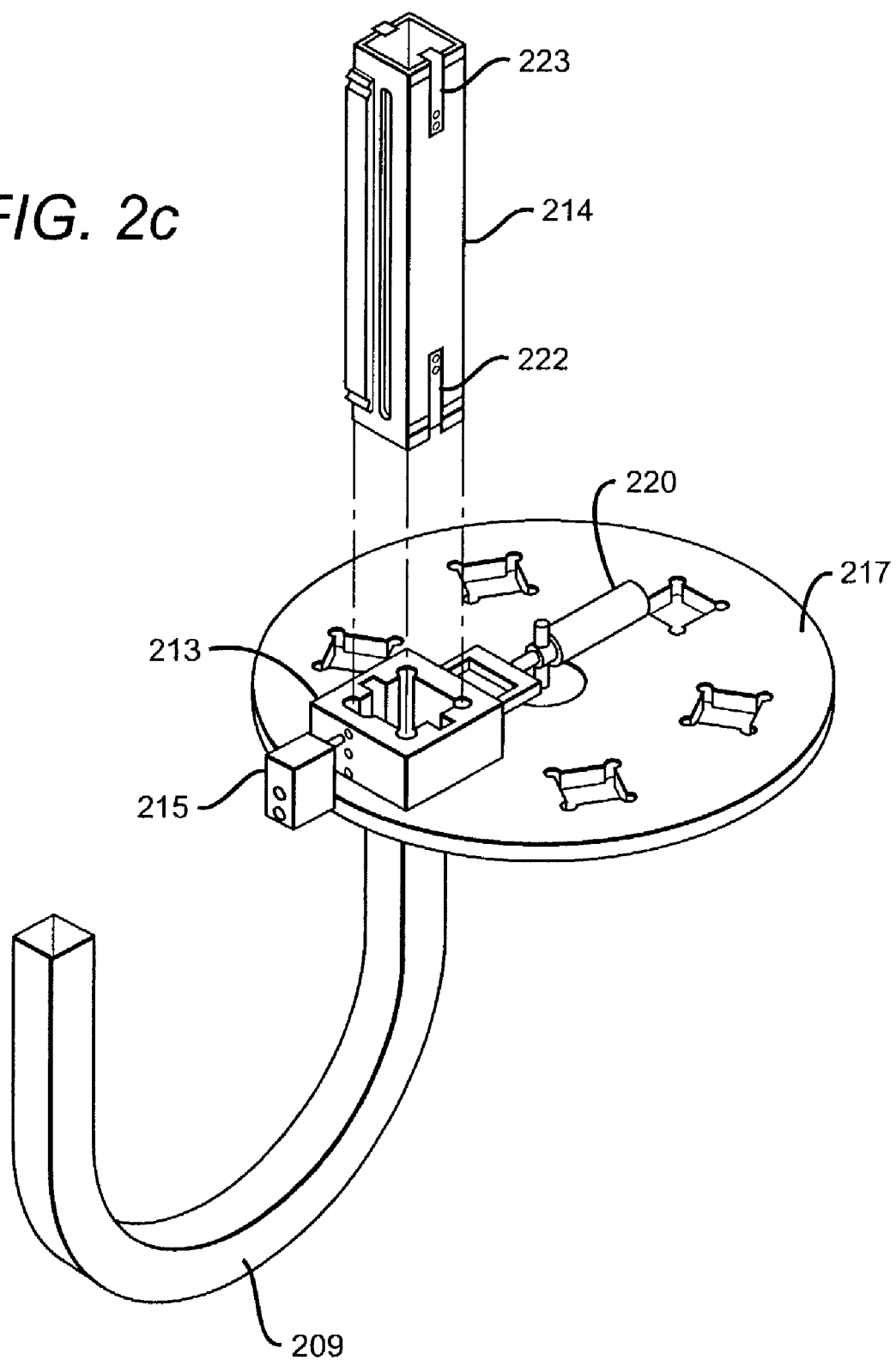
Figure 2D:
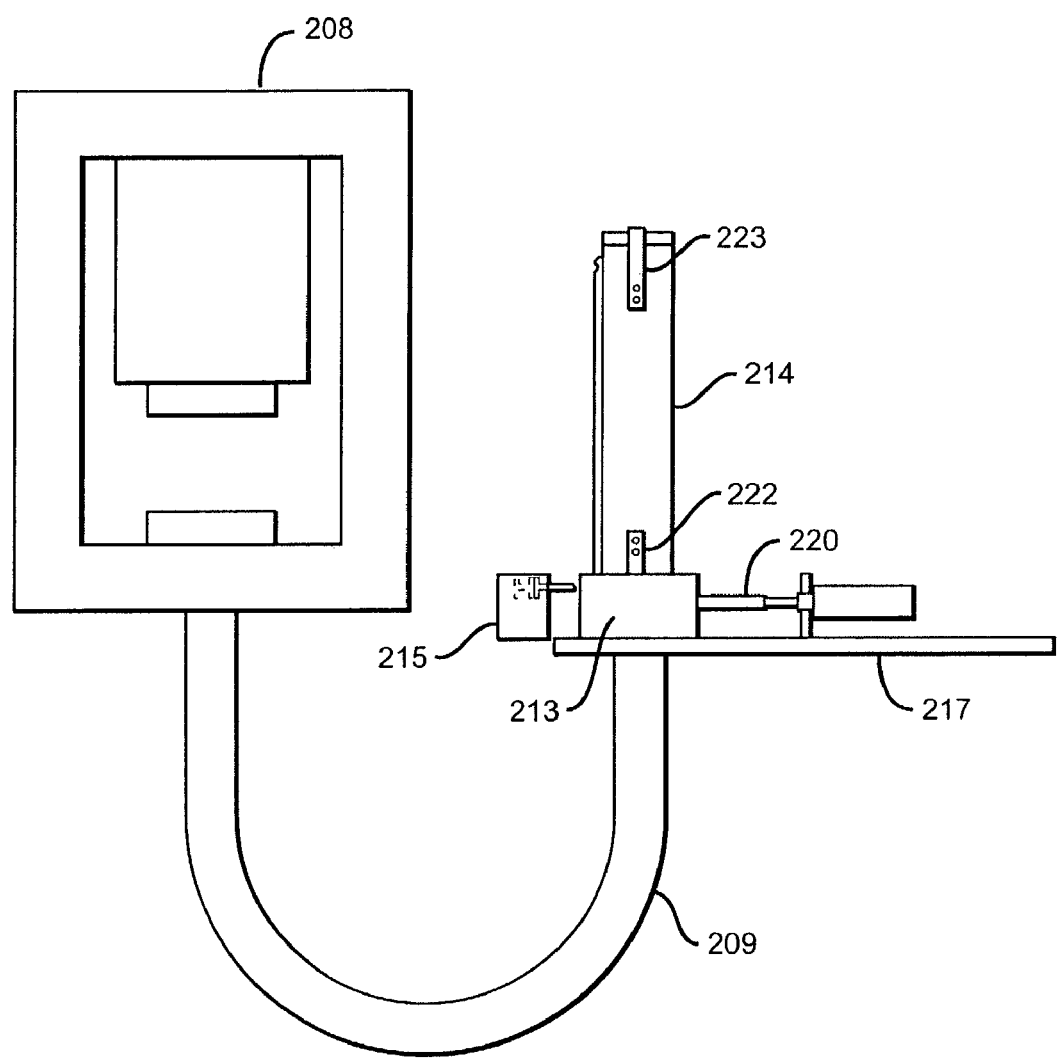
Figure 2E:
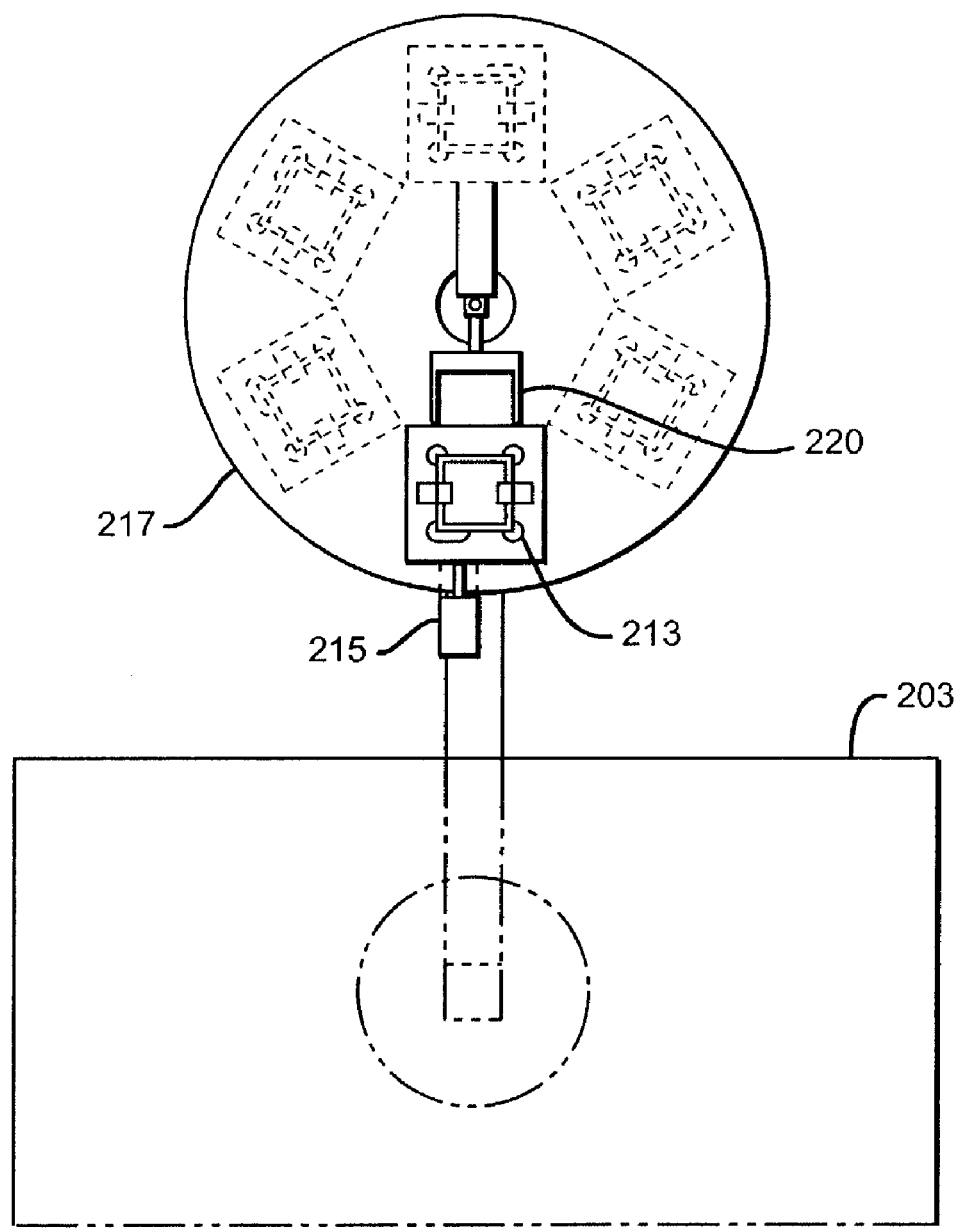
Figure 2F:
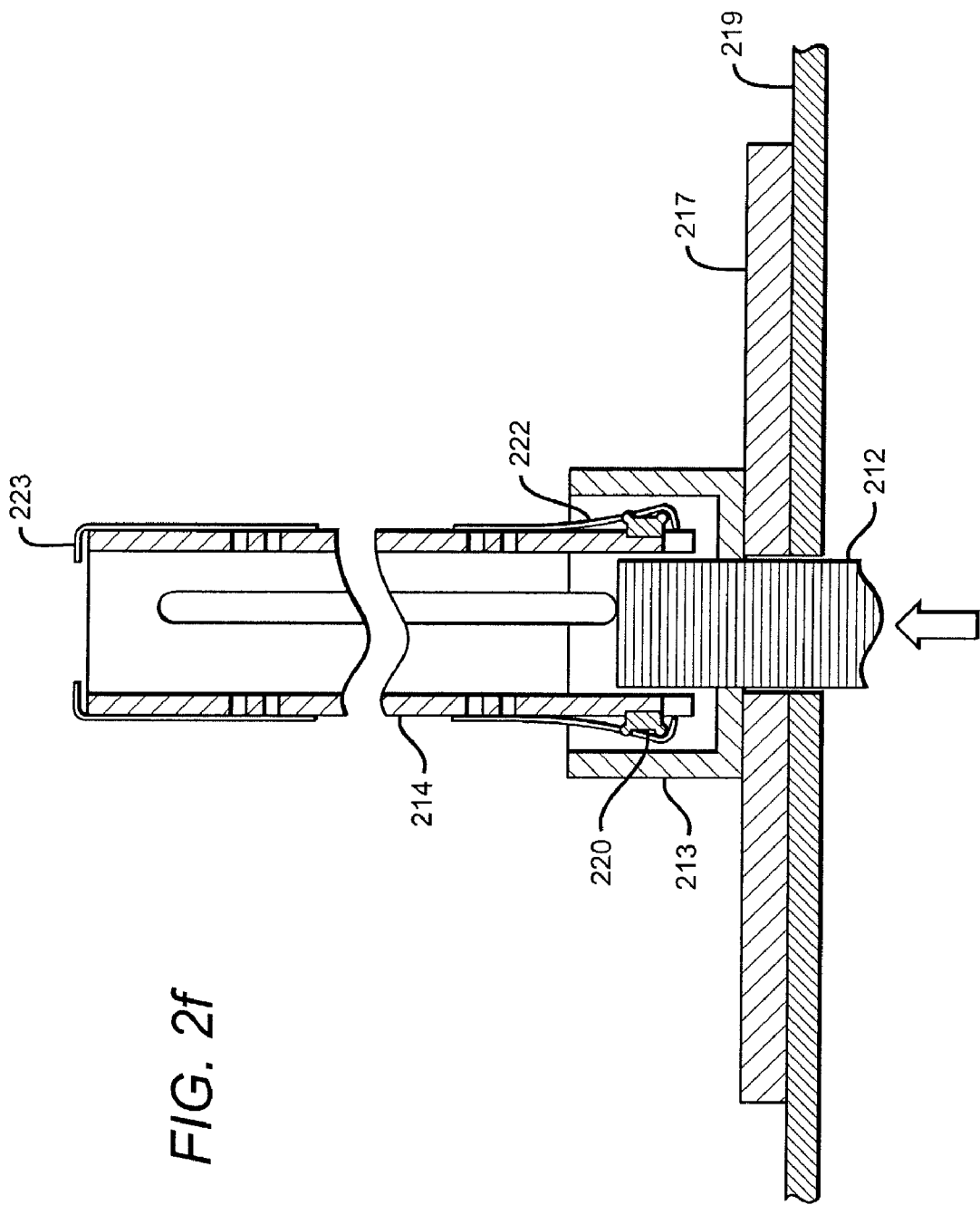

Refer to FIGS. 2a-f. FIG. 2a is a perspective view of a high speed blanking station and FIG. 2b is a top view of the copper strip shown in FIG. 2a. A copper strip material (200) in coil form (202) is loaded onto a coil unwinder (204), fed through a coil straightener (206) and into a progressive blanking die (208) in a high-speed press. Vent (pierce) holes may be punched in the copper strip at this point in the process as shown in FIG. 2b, however it is preferred that the vent holes be punched by a piercing press described subsequently with reference to FIG. 3A. A conveyor (210) moves the finished blank (212) to a cartridge loading station where the blanks are dropped into a cartridge (214) for subsequent transfer to an in-process inspection station. Scrap material is discarded (216). Finished blanks are then checked for proper thickness, length, width, burrs and die marks.

Alternatively, FIG. 2c, a loading chute (209) guides the finished blank to the cartridge loading base (213) where the blanks are forced up into the cartridge (214) for subsequent transfer to an in-process inspection station.

The loading turret (217) has six loading stations, and as each cartridge is sensed full by completion sensor (215), the loading turret is rotated to present an empty cartridge to the loading base. A clip release mechanism (220) is activated to release the retaining clip (222) at the bottom of the cartridge (214) to allow passage of the blanks into the cartridge. When the cartridge is sensed as full the clip release mechanism (220) is activated to engage the retaining clip. Since the cartridges are loaded up side down, another clip (223) is provided on the opposite end of the cartridge. This allows the cartridge to be flipped over and unloaded from the other end.

Figure 3A:
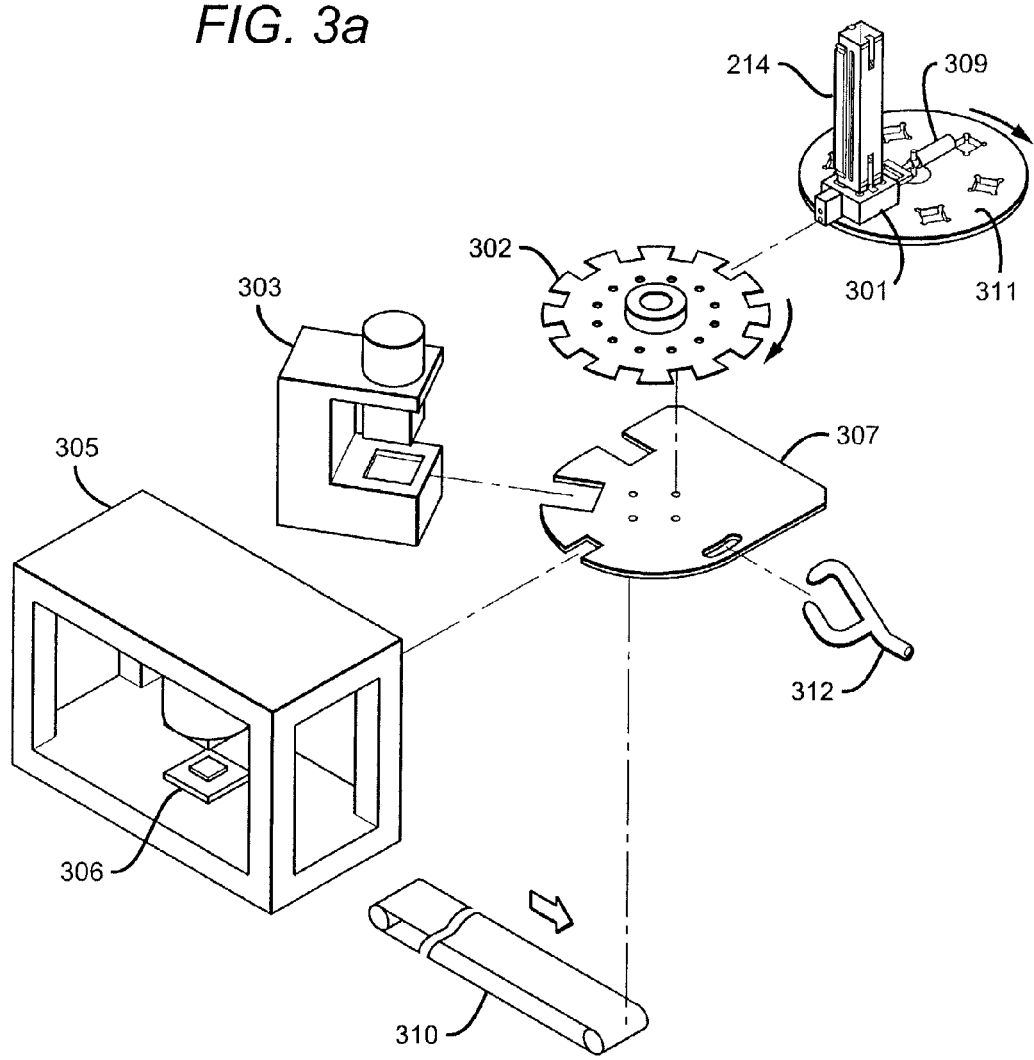
FIG. 3a is an exploded perspective view of a coining process mechanism embodying the invention.
Figure 3B:
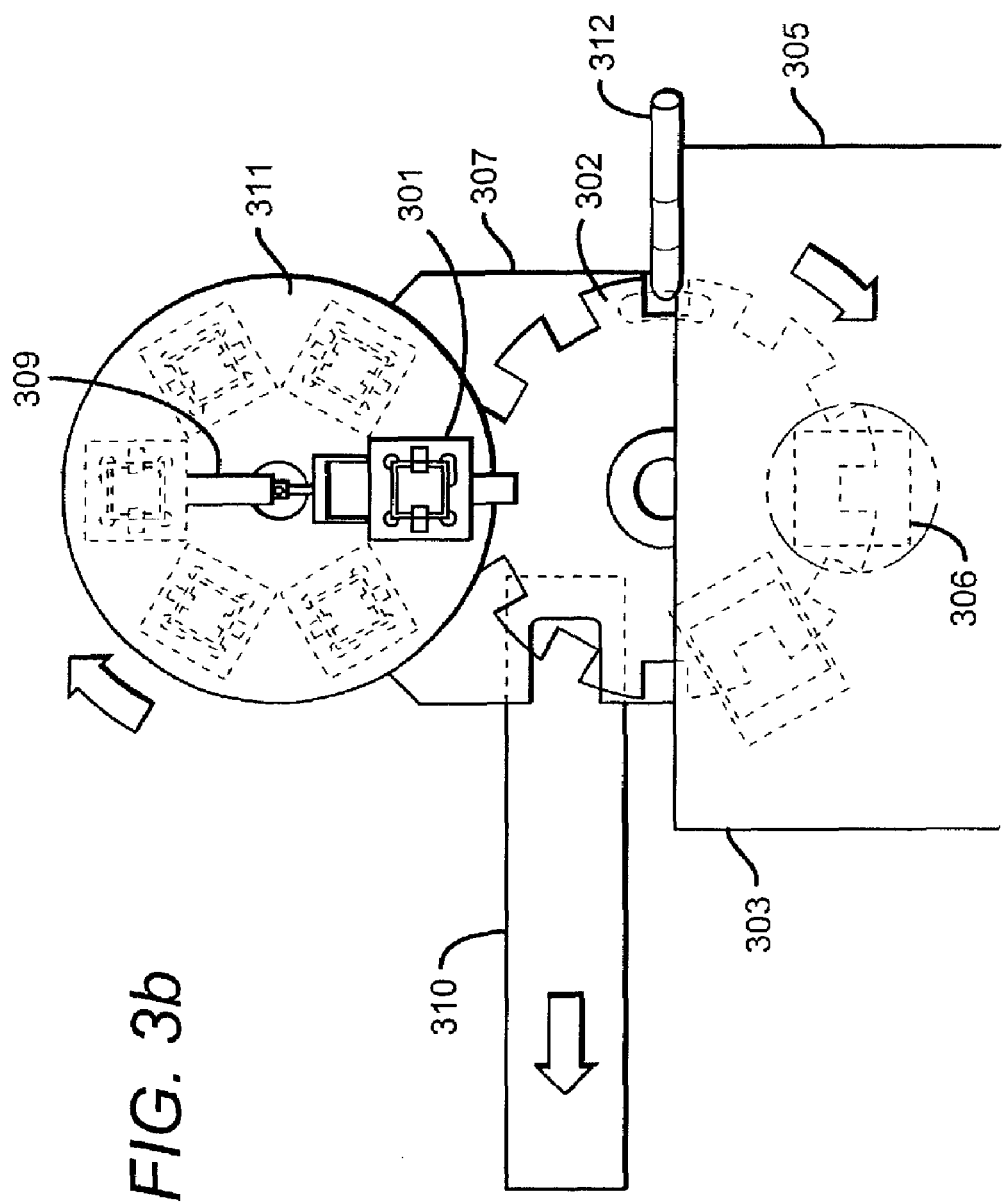
Figure 3C:
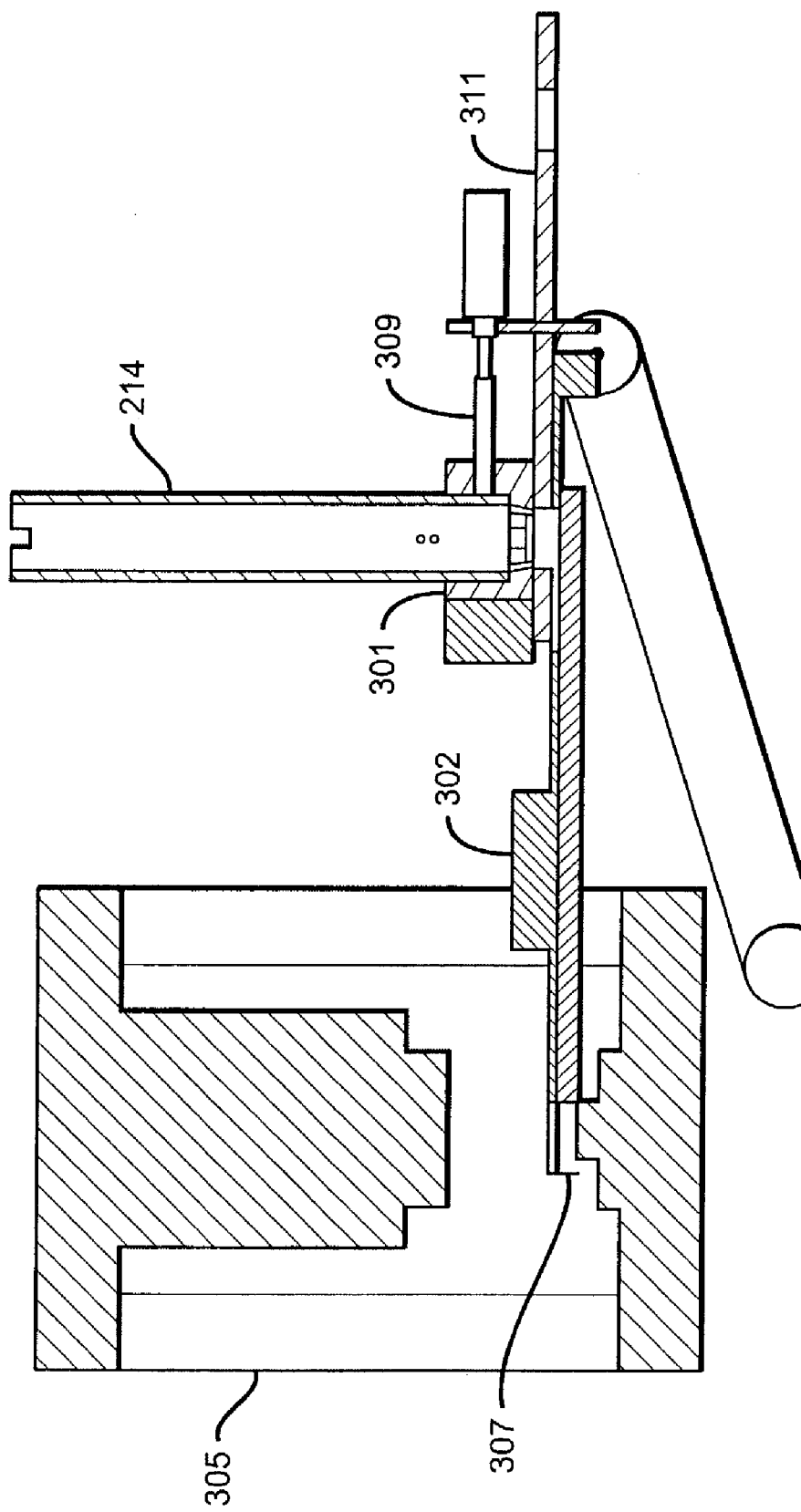
Figure 3D:
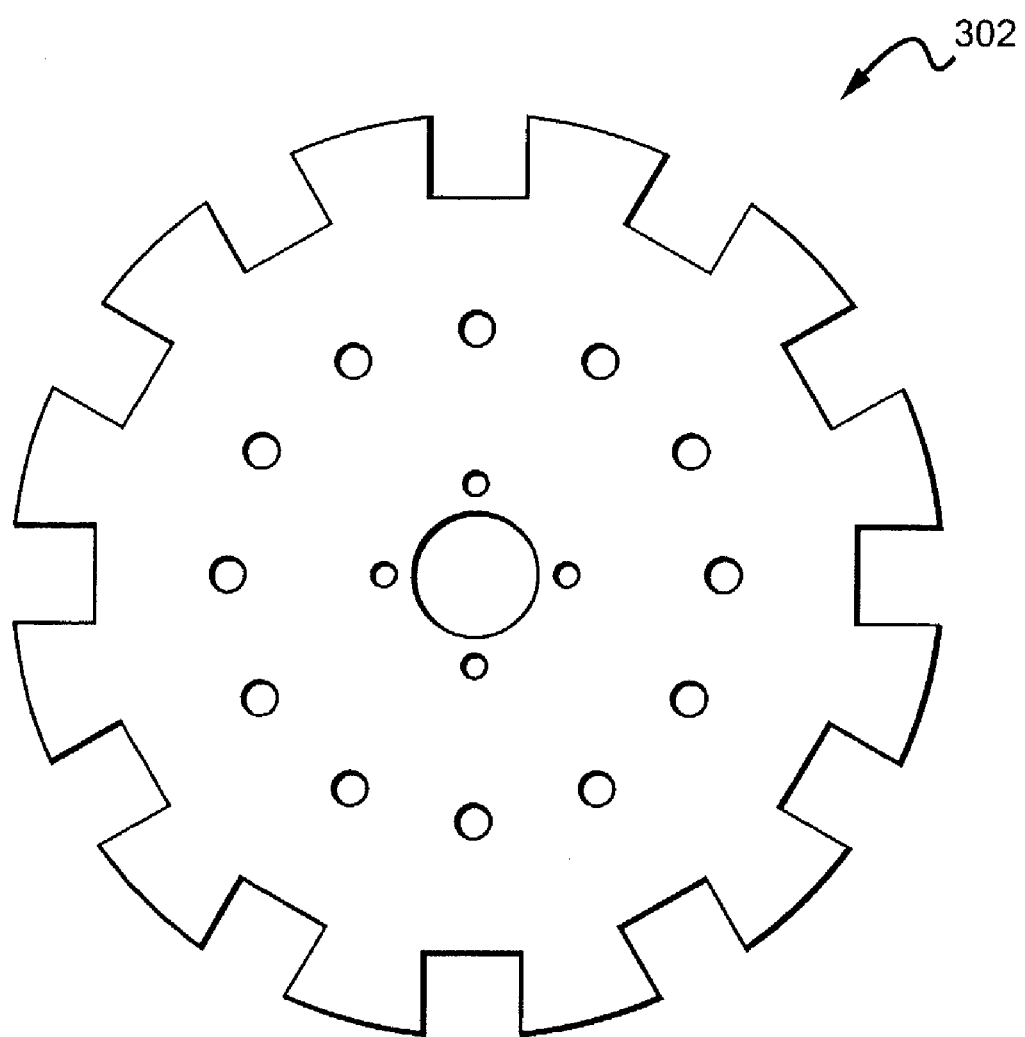

Refer to FIGS. 3a-d, which are views of a coining press embodying the invention. FIG. 3a is a perspective view of the coining press and FIG. 3b is a top view of the coining press shown in FIG. 3a. A full cartridge (214) is loaded into a unloading base (301) on an unloading turret (311) at the coining press where the blanks are fed from the cartridge onto a coining turret (302) that delivers the blanks one at a time first to an oiler (312) that puts a coating of oil on the part and then to a coining die cavity (306). A blank is coined and the coined lid is delivered, via the coining turret, to a piercing press (303) that punches a vent hole in the blank. The coined lid is delivered, via the coining turret, to an unload station where it is dropped onto a completion conveyor (310).

The coined lid is inspected for flatness, surface profiles, thickness, width and length and for surface defects at in-process inspection (104). The coined lid is moved by completion conveyor (310) from the unload station to a Deburr and Cleaning station. The unloading turret (311) is indexed clockwise to present another full cartridge to the unloading station.

Figure 4B:
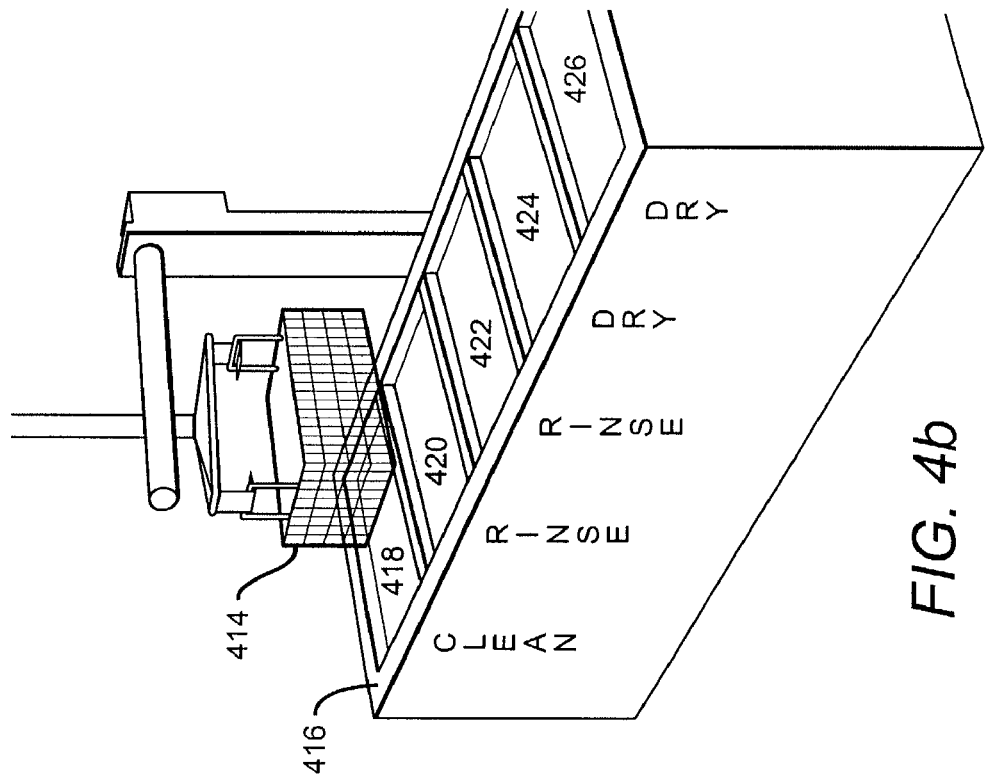
FIG. 4a-4b are a perspective views of a deburr and clean station.
Figure 4A:
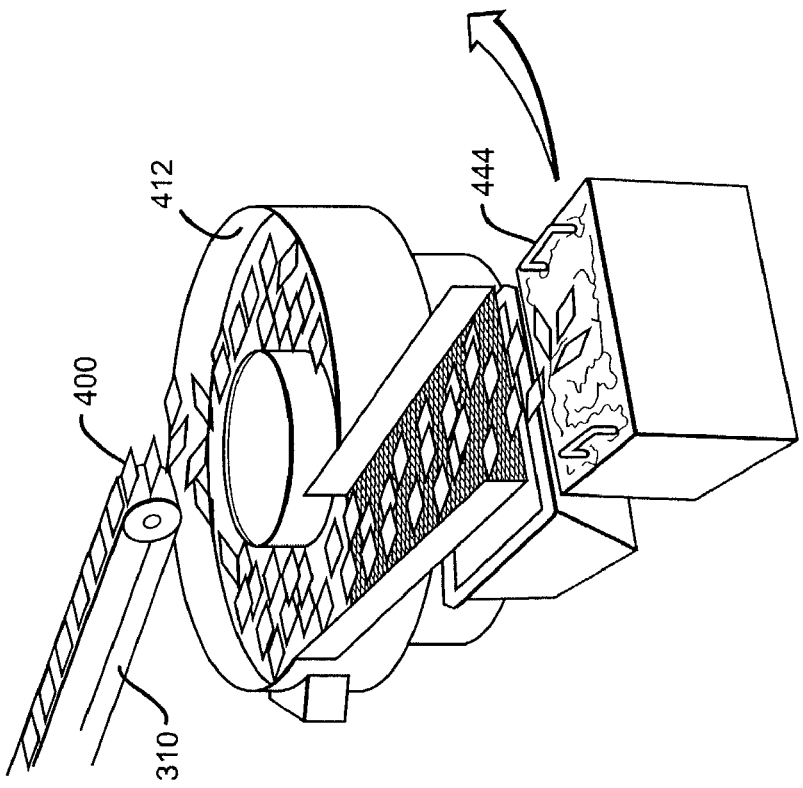

The deburr and clean station is shown in FIG. 4. The coined lids (400) that have been moved by the conveyor (310) from the coining press to the deburr unit are mixed with deburring media (412) and run through a set time cycle. The deburred lids are delivered to a basket (414), which is loaded into a Cleaning Machine (416). The Cleaning Process consists of a cleaning station (418), two hot DI rinse stations (420, 422), and two hot air drying stations (424, 426).

The lids are packed into in-process transfer containers for nickel plating and cleaning. The lids are loaded into "barrels" and loaded onto an automated plating line. The lids are cleaned with a light etchant, barrel plated with Bright Nickel, cleaned with hot DI water and hot air dried. Plated lids are inspected for plating thickness and tested for proper plating adhesion Plated lids are received through receiving and sent for Final inspection. Final Inspection Dimensional consists of flatness, thickness, rim height and profile. Accepted lids are packed into shipping trays and crated for delivery to a chip manufacturer (108).

Coining Press

Figure 5C:
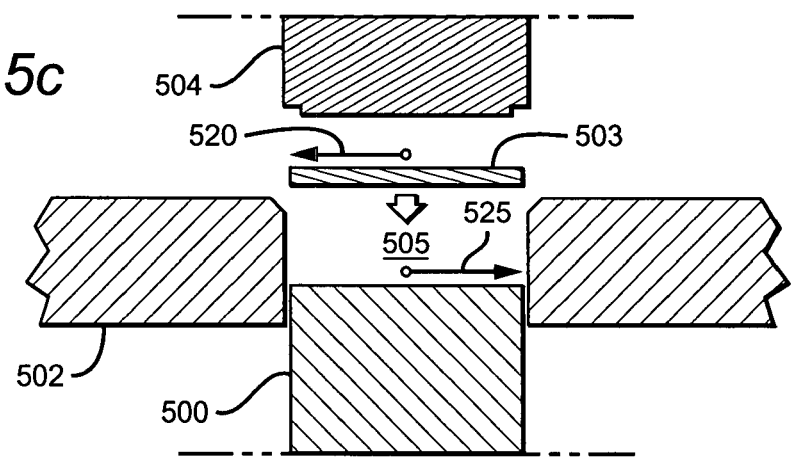
Figure 5D:
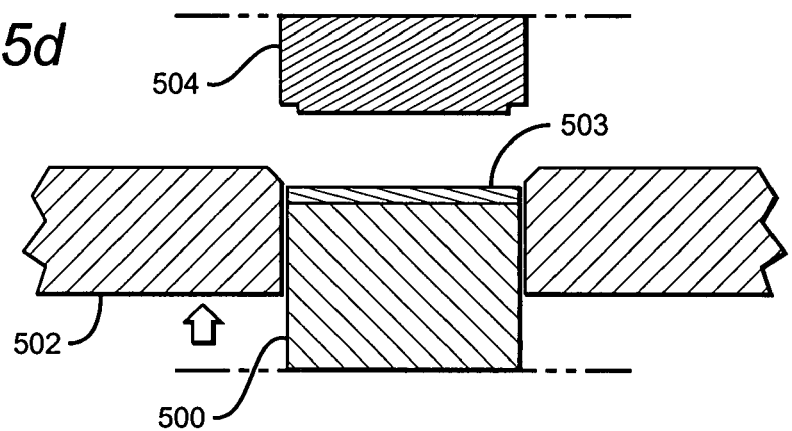
Figure 5E:
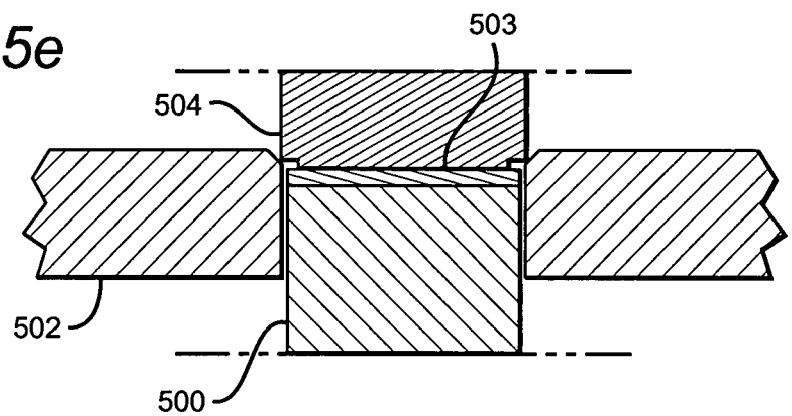

Refer to FIGS. 5a-5b which are end and side sectional views of a knuckle action coining press embodying the invention, shown during successive stages of operation and FIGS. 5c-5e which are side sectional views of a coining die within the coining press shown in FIGS. 5a-5b. In the coining press, a lower die (500) is mounted on a fixed height stationary bed (502) with an upper die (504) located on the underside of a main slide (506). An upper knuckle journal (508) is connected to the fixed bed (510) and a lower journal (512) is connected to the main slide, both pivoting about a connecting rod (514).

As shown in FIGS. 5c-5e, the upper die (504) and lower die (500) are moved by the knuckle action press. Starting at top dead center where the upper die (504) within the main slide (506) is in its uppermost position, a blank (503) is dropped into the die cavity (505) within a collar (502). A crankshaft (516) rotates and the knuckle is gradually opened to initiate a downward movement to the slide and hence the die (504) as shown in FIG. 5b. An upward movement to the lower die (500) acts to seat the blank in the cavity. At the point where upper and lower journals (508, 512) are almost in line, the dies (500, 504) close to exert a powerful squeezing force, as shown in FIG. 5c. As shown in FIG. 5a further crankshaft rotation opens the dies as the slide returns to its top dead center position in readiness for the next stroke.

Electromechanical Dial Feed for Knuckle Press

As described with respect to FIG. 3, a twelve station dial feed coining turret (302) for square or rectangular blanks is loaded from a cartridge (300). The feed is monitored for "No Blank" "Double Blank" and Die Fault conditions. The blanks are pushed into the dial plate coining turret from a loading base (301). The coining turret indexes clockwise carrying the blank to the collar (502) and lower die (500). As the top die (504) lowers with the slide, the blank is lowered into the collar creating a well (505). The top die strikes the blank and rises away from the collar. The coined blank is ejected from the collar into the dial plate which indexes the finished blank away to the drop out station. The dial plate also presents a new blank (503) to the collar (502).

If a Multi-Strike feature is selected the blank is not ejected from the Collar until a preselected number of strikes are completed. The Dial Plate also remains stationary during multi-strike operation until the coined lid is ejected from the Collar.

The Dial Plate is driven by a ServoMotor through a Cam and Turret arrangement. This enables a very accurate and repeatable index of the Dial Plate while enabling the programmable feature of the ServoMotor.

Software

Figure 6:
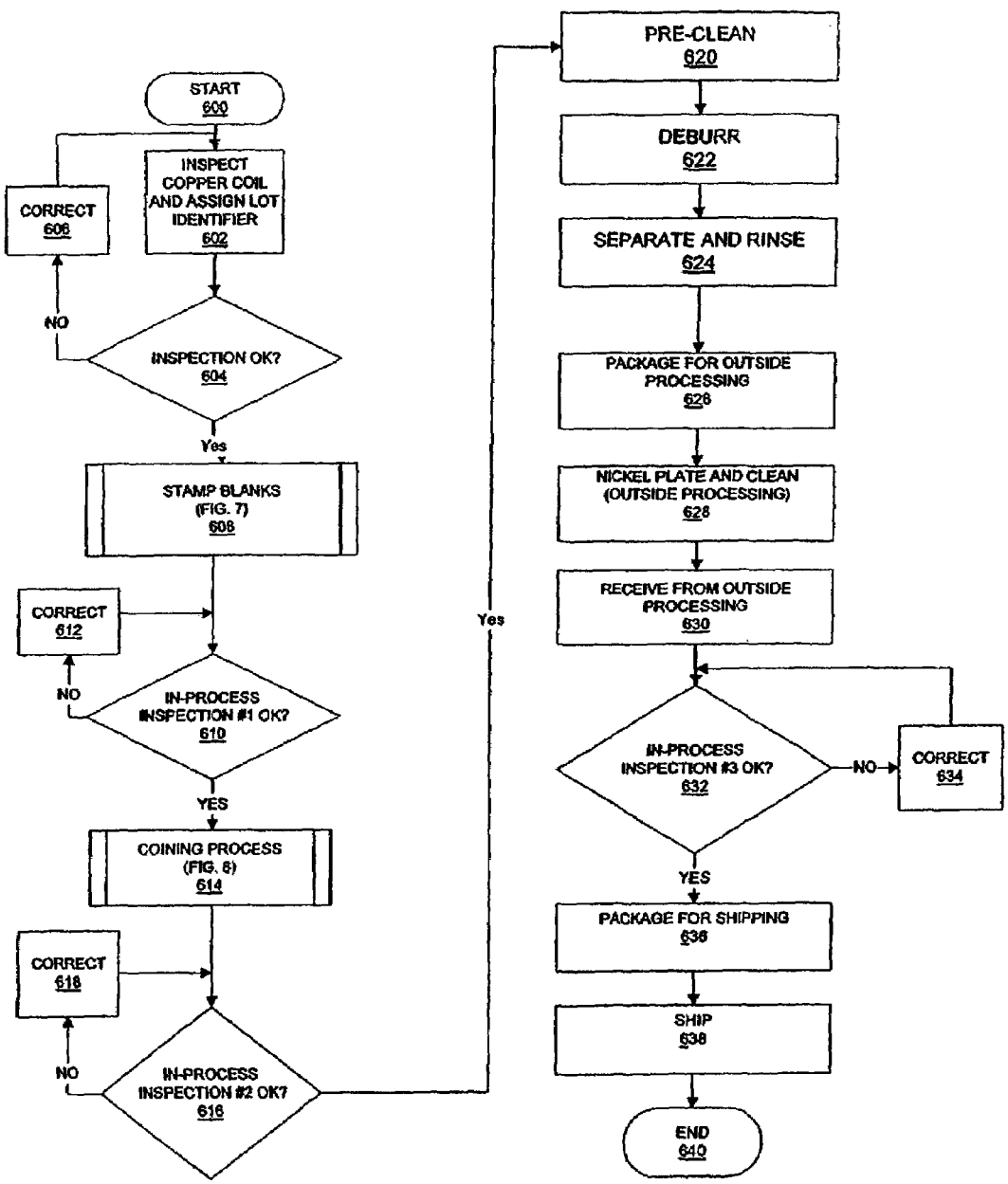

Refer to FIGS. 6-9 which comprise a flow diagram of the software controls for controlling the operation of the apparatus shown in FIGS. 1-5. In FIG. 6, the process starts (600) with a call to the High-Speed Blanking subroutine (602), detailed in FIG. 7.

High Speed Blanking Subroutine

Figure 7:
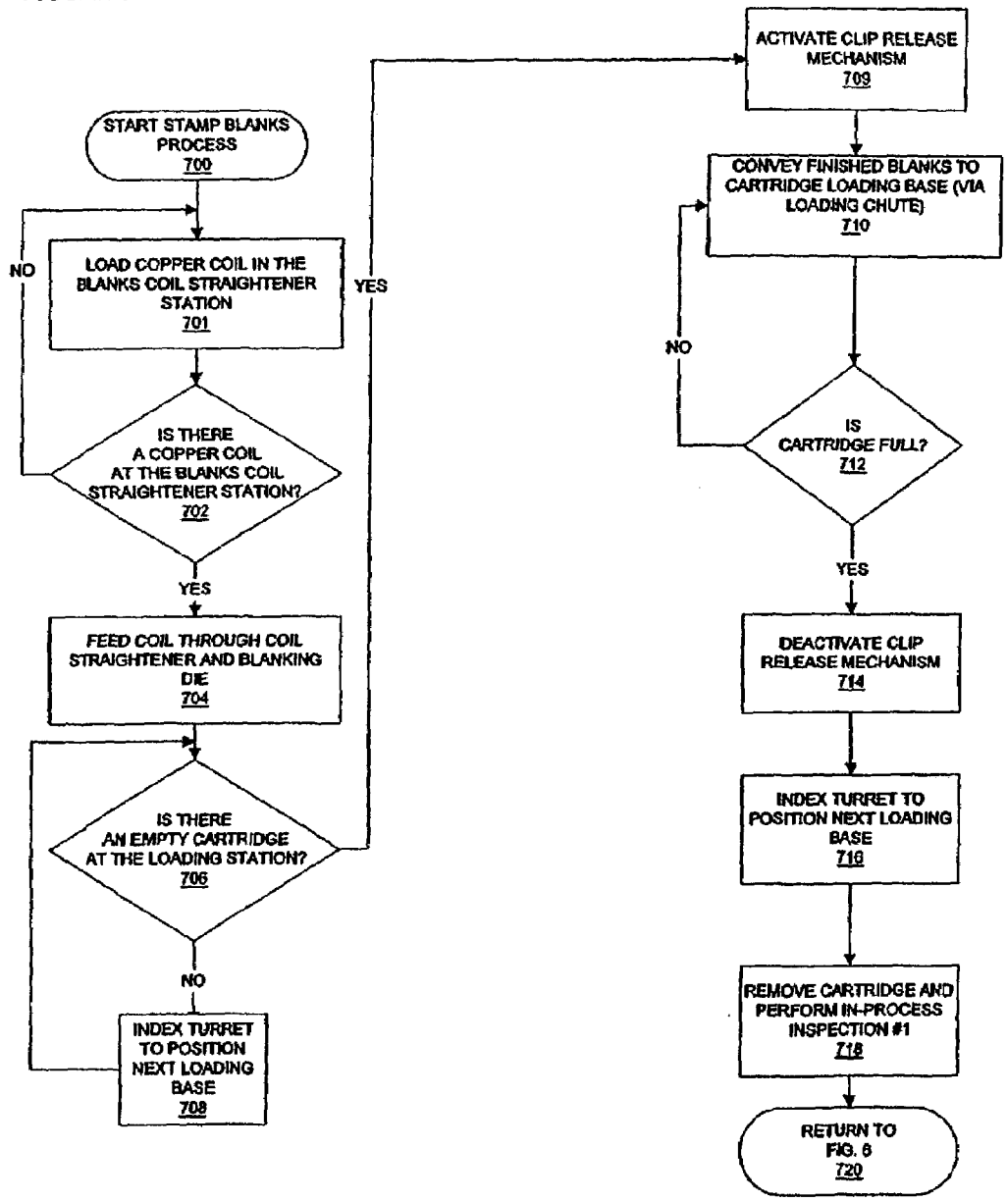

Refer to FIG. 7. The process starts (700) with a copper strip material in coil form being loaded onto a coil unwinder (702). The copper coil is fed through a coil straightener and into a progressive blanking die in a high-speed blanking press (704). A conveyor moves the finished blank to a cartridge loading station (706). The blanks are dropped (708) into the cartridge for subsequent transfer to the blanks hopper. Scrap material is collected in a scrap material bin. When the cartridge is full (702) it is removed and taken to an inspection #1 station (709) where finished blanks are checked for proper thickness, length, width, burrs and die marks. The flow returns (710) to FIG. 6.

Figure 8:
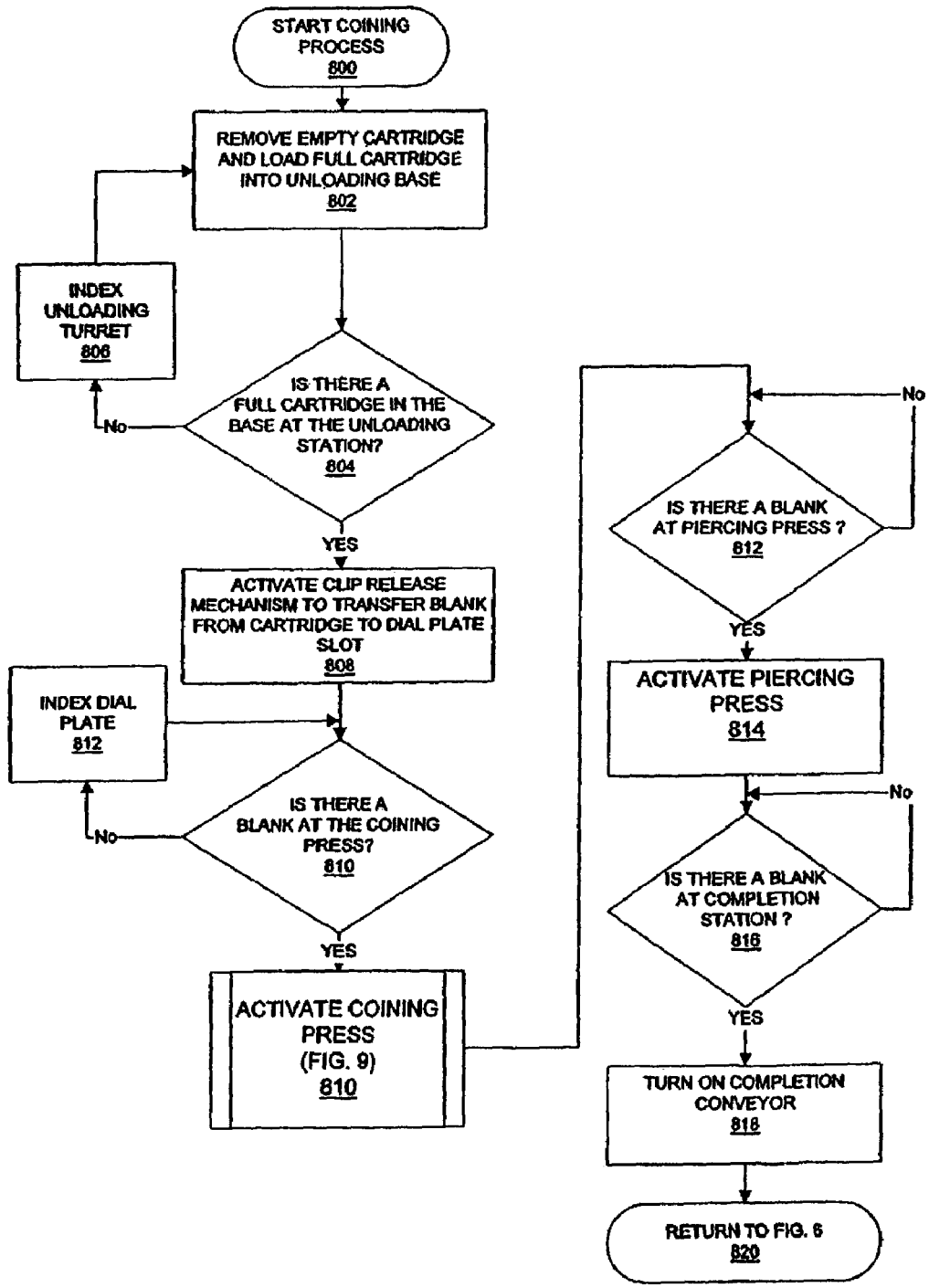

At the end of inspection (604) the process calls the coining subroutine (606), detailed in FIG. 8. A full cartridge is loaded into a blanks hopper (801) at the coining press. The blanks are fed from the hopper and pushed into a turret dial plate (802) that delivers the blanks one at a time into the coining die cavity (808). The Knuckle Press Subroutine (810), detailed in FIG. 9, is called when a blank is sensed at the coining die cavity.

Knuckle Press Operation

Figure 9:
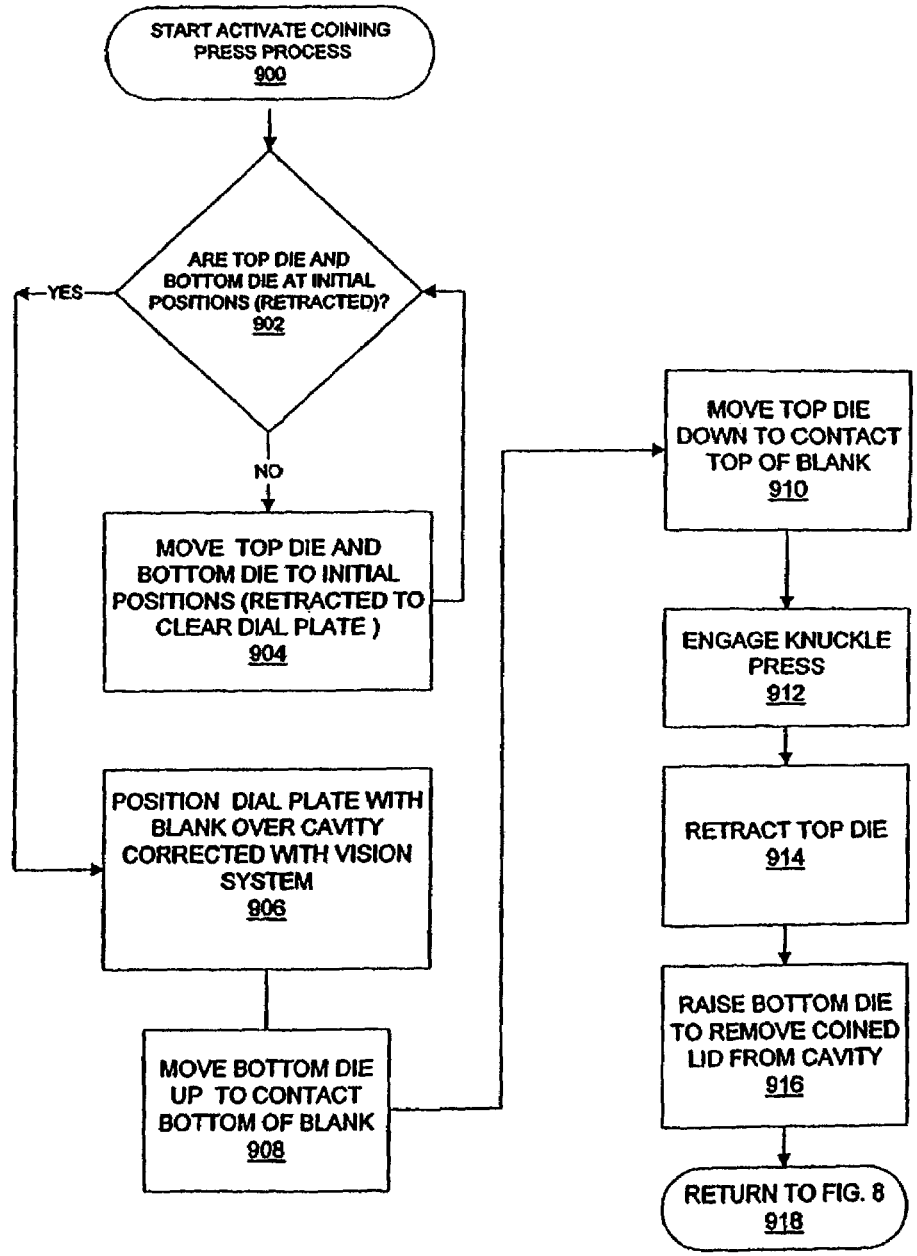

Refer to FIG. 9. The dial plate indexes around carrying the blank to the collar and lower die (905). As the top die lowers with the slide, the blank is lowered into the collar creating a well. The top die strikes the blank and rises away from the collar. The coined blank is ejected from the collar into the dial plate which indexes the finished blank away to the drop out station, it also presents a new blank to the collar.

The upper die and lower die are moved by knuckle action press (904) to where the upper die within the main slide is in its uppermost position (902), a blank is dropped (905) into the die cavity within the collar The lower die is moved to contact the bottom of the blank (906) as the top die is moved downward (908). A crankshaft rotates and the knuckle is gradually opened to initiate a downward movement to the slide and hence the die to engage the knuckle press (910). The top die is retracted (912) and the bottom die is raised to remove the coined lid from the cavity (914). The turret is rotated to position the next blank and to release a coined lid from the turret (918). The upper die and lower die are moved by knuckle action press to where the upper die within the main slide is in its uppermost position (920) and the flow returns to FIG. 8.

The next coined lid is delivered, via the turret, to an unload station (812). The coined lid is moved by conveyor from the unload station to a Deburr and Cleaning station (814). When the blanks hopper is empty (816), the flow returns to FIG. 6.

Inspection #2

Refer to FIG. 6. The coined lid is inspected (608) for flatness, surface profiles, thickness, width and length and for surface defects prior to deburr and cleaning.

Deburr and Clean

The coined lids that have passed inspection #2 (608) are taken to a deburr and clean station (610). At the deburr and clean station the lids are mixed with deburring media and run through a set time cycle. The deburred lids are delivered to a basket, which is loaded into the Cleaning Machine. The Cleaning Process consists of a cleaning station, two hot DI rinse stations, and two hot air drying stations. The lids are then packed into in-process transfer containers for nickel plating and cleaning (612).

Nickel Plate

The lids are "racked" and loaded onto the automated plating line (612). The lids are cleaned with a light etchant, barrel plated with Bright Nickel, cleaned with hot DI water and hot air dried.

Inspection #3

Plated lids are inspected (614) for plating thickness and tested for proper plating adhesion. Plated lids are received through receiving and sent for Final inspection. Final Inspection Dimensional consists of flatness, thickness, rim height and profile.

Pack and Ship

Accepted lids are packed into shipping trays and crated for delivery to chip manufacturer (616).

Epilogue

The finished product as described herein can be used in various industries and applications where the following attributes find utility. The product is preferably made from a stock of ductile material, such as a thin, flexible sheet or strip of metal or composite metal. The finished product includes an inset cavity (depression) in a surface the part. For a heat spreader or stiffener lid the product will be in the form of a cap with a flat side and an opposite side having a depression such that the lid will fit like a cap over a semiconductor package. The cap will constrain the substrate in order to prevent warping or other movement relative to the semiconductor die which may be caused by thermal cycling. The depression is defined as a reduction of over about 10% between the top surface and the bottom surface of the product and requiring geometric tolerances, such as a flatness specification of under about 0.01 inches over any of the surfaces of the part.

In the method and apparatus described, a square or rectangular blank is cut from metal. The blank is loaded onto an automatic transfer mechanism that transfers blanks one at a time to a coining station of a coining press. The press is of a type having high tonnage, speed and dwell characteristics, such as a knuckle press. A lubricant is applied to both sides of the blank, either directly to the blank or to the tooling. The coining press is activated to coin the blank resulting in a finished product with a depression and the product is transferred from the coining press to free the die cavity for the next blank. To insure adequate flatness, the blanks may have to be struck multiple times in the coining press.

"Shaped upper and lower die punches form the product. As shown in the drawings, the upper die is in a shape that will press the desired depression in the finished product. A guide system between the lower die (knockout punch) and the upper die (punch) may be utilized to align the part in the coining die cavity (505) of the coining press (the knockout cavity) to positively position the die punch and the knockout cavity during the coining process. An approximately 10-minute draft angle may be provided in the knockout cavity to facilitate movement for correct seating of the blank part. The cavity radii 525 should be larger than the blank radii 520 to insure self-registration of the blank into the knockout cavity."

The coining press shown in the drawings is a knuckle press, however other presses that have this capability of high tonnage, speed and dwell characteristics may be used. The transfer system shown in the drawings is a turret, but those skilled in the art will understand that the transfer mechanism may be any system that moves a part, independent of the remainder of the feed material, from process station to process station. For example, but not as a limitation, a transfer system can include conveyor belts, dial feed plates, paddles, chains, cams, servos, air cylinders, etc. The process stations can include blanking, coining, piercing, clipping, secondary forming, etc.

A shaped punch can include surface features to facilitate the formation of part features such as the depression and result in a specified geometry on the various surfaces of a part including the cavity, the topside, the backside, the inset cavity profile, any included pedestal and all other product geometry and can be formed on both the upper die (punch) and lower die (knockout punch). For example, the upper die may be shaped to ensure that any resilience of the blank is accommodated to result in flatness after the operation of the coining press. The lower die may be shaped to conform if necessary to the shape of the upper die.

The guide system can include pins, or any other alignment system that insures correct placement of the blank into the knockout cavity.

A feature of the method is the fit of the blank into the cavity. The cavity radii may be formed to be larger than those of the blank to insure correct placement and seating of the blank in the die cavity. The blank is of such a size and shape that it nests itself in the die cavity for self-centering registering in the die cavity.

The ductile materials used in this method are preferably annealed to facilitate adequate material flow and forming. In the strip feed operation, the material should be pulled through the blanking station.

It should be understood that the invention is not limited to the specific parameters, materials and embodiments described above. Various modifications and variations may be made within the scope of the present invention.

The invention claimed is:

1. A method of manufacturing a product suitable for semiconductor chip devices, from a ductile material, said product having a cavity with a depth reduction and a prescribed flatness, the method comprising steps of:
   loading a blank onto an automatic transfer mechanism, wherein the blank is separated from a metal strip and wherein the blank comprises a radius;
   transferring said blank to a coining station of a coining press;
   activating said coining press to coin said blank resulting in said product; and
   transferring said product from said coining press, wherein the product is a ductile material having a cavity with a depth reduction greater than about 10% and a flatness under about 0.01 inches over surfaces of said product and wherein the product comprises a heat spreader or stiffener lid.

2. The method of claim 1 wherein during step C, of coining said blank, shaped tooling, upper and lower dies, is utilized to coin said product.

3. The method of claim 2 wherein prior to said step C, of transferring said blank to a coining station, a lubricant is applied to said blank, either directly to the blank or to said coining press.

4. The method of claim 1 wherein subsequent to said blank being coined to form the product said product is returned to said transfer mechanism and delivered by said transfer mechanism to a subsequent station.

5. The method of claim 4 wherein subsequent to said product being returned to said transfer mechanism said product is delivered to an unload station.

6. The method of claim 4 wherein said product is not transferred out of the coining station until a preselected number of strikes of said coining press are completed.

7. The method of claim 1, wherein blanks separated from said metal strip are inserted into a cartridge and transferred to said automatic transfer mechanism in said cartridge.

8. The method of any one of claims 1-3 or 4-7 wherein the automatic transfer mechanism is a rotating turret.

9. The method of any one of claims 1-3 or 4-7 wherein guides are used to positively position a die punch and a knockout cavity having a radius during the coining process.

10. The method of claim 9, wherein the knockout cavity radii are larger than the blank radii to insure self-registration of the blank into the knockout cavity.

* * * * *